United States Patent
Chou et al.

(10) Patent No.: US 10,474,026 B2
(45) Date of Patent: Nov. 12, 2019

(54) METHOD FOR CORRECTING BEVEL CORNERS OF A LAYOUT PATTERN

(71) Applicant: UNITED MICROELECTRONICS CORP., Hsin-Chu (TW)

(72) Inventors: Kuei-Hsu Chou, Pingtung County (TW); Cheng-Te Wang, Hsinchu County (TW); Yung-Feng Cheng, Kaohsiung (TW); Jing-Yi Lee, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 463 days.

(21) Appl. No.: 15/335,458

(22) Filed: Oct. 27, 2016

(65) Prior Publication Data

US 2018/0120693 A1 May 3, 2018

(51) Int. Cl.
*G06F 17/50* (2006.01)
*G03F 1/36* (2012.01)

(52) U.S. Cl.
CPC ............ *G03F 1/36* (2013.01); *G06F 17/5081* (2013.01)

(58) Field of Classification Search
CPC . G03F 1/36; G03F 1/70; G03F 7/2061; G03F 7/70441; G03F 7/2063; G03F 1/20; G03F 1/144; G03F 7/70125; G03F 7/70433; G03F 7/2047; G06F 17/5081; G06F 17/50; G06F 17/5068; G06F 2217/12
USPC ..................................................... 716/50–55
See application file for complete search history.

(56) References Cited

U.S. PATENT DOCUMENTS

| | | | |
|---|---|---|---|
| 7,089,519 B1* | 8/2006 | Teig .................... | G06F 17/5072 716/123 |
| 7,263,677 B1* | 8/2007 | Teig .................... | G06F 17/5068 716/54 |
| 7,865,863 B2 | 1/2011 | Lippincott | |
| 7,926,002 B2 | 4/2011 | Word | |
| 8,146,025 B2 | 3/2012 | Yang | |
| 8,381,153 B2* | 2/2013 | Chiang ............... | G06F 17/5068 716/110 |
| 8,745,550 B2 | 6/2014 | Cheng | |
| 8,898,598 B1* | 11/2014 | Zhang ................. | G06F 17/5081 716/118 |

* cited by examiner

*Primary Examiner* — Nghia M Doan
(74) *Attorney, Agent, or Firm* — Winston Hsu

(57) ABSTRACT

A method of correcting a layout pattern is provided in the present invention. The method includes the following steps. A layout pattern including at least two adjacent rectangular sub patterns is provided. The layout pattern is then input into a computer system. An optical proximity correction including a bevel correction is then performed. The bevel correction includes forming a bevel at a corner of at least one of the two adjacent rectangular sub patterns, wherein the bevel is formed by chopping the corner, and moving the bevel toward an interaction of two neighboring segments of the bevel if a distance between the bevel and the other rectangular sub pattern is larger than a minimum value. The angle between a surface of the bevel and a surface of the rectangular sub pattern is not rectangular. The layout pattern is output to a mask after the optical proximity correction.

16 Claims, 8 Drawing Sheets

METHOD FOR CORRECTING BEVEL CORNERS OF A LAYOUT PATTERN

BACKGROUND OF THE INVENTION

1. Field of the Invention

The present invention relates to a method for correcting a layout pattern, and more particularly, to a method including a bevel correction for correcting a layout pattern.

2. Description of the Prior Art

In semiconductor manufacturing processes, in order to transfer an integrated circuit onto a semiconductor wafer, the integrated circuits from a database are first designed as a layout pattern and a photomask is then manufactured according to the layout pattern. Patterns on the photomask may then be able to be transferred to the semiconductor wafer. The steps mentioned above may be regarded as a photolithographic process. The layout pattern has to be extremely accurate for forming delicate integrated circuits so as to align with the patterns of the previous and following steps.

In the photolithographic process, deviations often occur when the patterns on the photomask are transferred onto the wafer surface and jeopardize the performance of the semiconductor device. Such deviations are usually related with the characters of the patterns to be transferred, the topology of the wafer, the source of the light and various process parameters.

There are many kinds of verification methods, correction methods and compensation methods for the deviations caused by the optical proximity effect, process rules (PRC) and lithography rules (LRC) to improve the image quality after transfer. Some of the known methods are called optical proximity correction (OPC), process rule check (PRC) and lithography rule check (LRC). The commercially available OPC software may test problems such as pitch, bridge, and critical dimension uniformity in the layout patterns. Such software may correct the standard layout patterns on the masks using the theoretical image, so as to obtain correctly exposed image patterns on the wafers.

SUMMARY OF THE INVENTION

It is one of the objectives of the present invention to provide a method for correcting a layout pattern. An optical proximity correction including a bevel correction is performed to forming a bevel at a corner of a rectangular sub pattern in the layout pattern, and the bevel is moved toward an interaction of two neighboring segments of the bevel under the distance limitation between two adjacent rectangular sub patterns for fully extending the rectangular sub patterns in the layout pattern.

A method of correcting a layout pattern is provided in an embodiment of the present invention. The method includes the following steps. A layout pattern including at least two adjacent rectangular sub patterns is provided. The layout pattern is then input into a computer system. An optical proximity correction including a bevel correction is then performed. The bevel correction includes forming a bevel at a corner of at least one of the two adjacent rectangular sub patterns, wherein the bevel is formed by chopping the corner, and moving the bevel toward an interaction of two neighboring segments of the bevel if a distance between the bevel and the other rectangular sub pattern is larger than a minimum value. The layout pattern is output to a mask after the optical proximity correction.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-5 are schematic drawings illustrating a method for correcting a layout pattern according to a first embodiment of the present invention, wherein FIG. 1 is a flow chart of the method for correcting the layout pattern according to the first embodiment, FIG. 3 is a schematic drawing in a step subsequent to FIG. 2, FIG. 4 is a schematic drawing in a step subsequent to FIG. 3, and FIG. 5 is a schematic drawing in a step subsequent to FIG. 4.

FIG. 6 and FIG. 7 are schematic drawings illustrating an orthogonal correction according to some embodiments of the present invention, wherein FIG. 7 is a schematic drawing in a step subsequent to FIG. 6.

FIG. 9 and FIG. 10 are schematic drawings illustrating a method for correcting a layout pattern according to a second embodiment of the present invention, wherein FIG. 9 is a flow chart of the method for correcting the layout pattern according to the second embodiment, and FIG. 10 is a schematic drawing illustrating the layout pattern after the optical proximity correction.

FIG. 11 and FIG. 12 are schematic drawings illustrating a method for correcting a layout pattern according to a third embodiment of the present invention, wherein FIG. 11 is a flowchart of the method for correcting the layout pattern according to the third embodiment, and FIG. 12 is a schematic drawing illustrating the layout pattern after the optical proximity correction.

DETAILED DESCRIPTION

Figure 1:
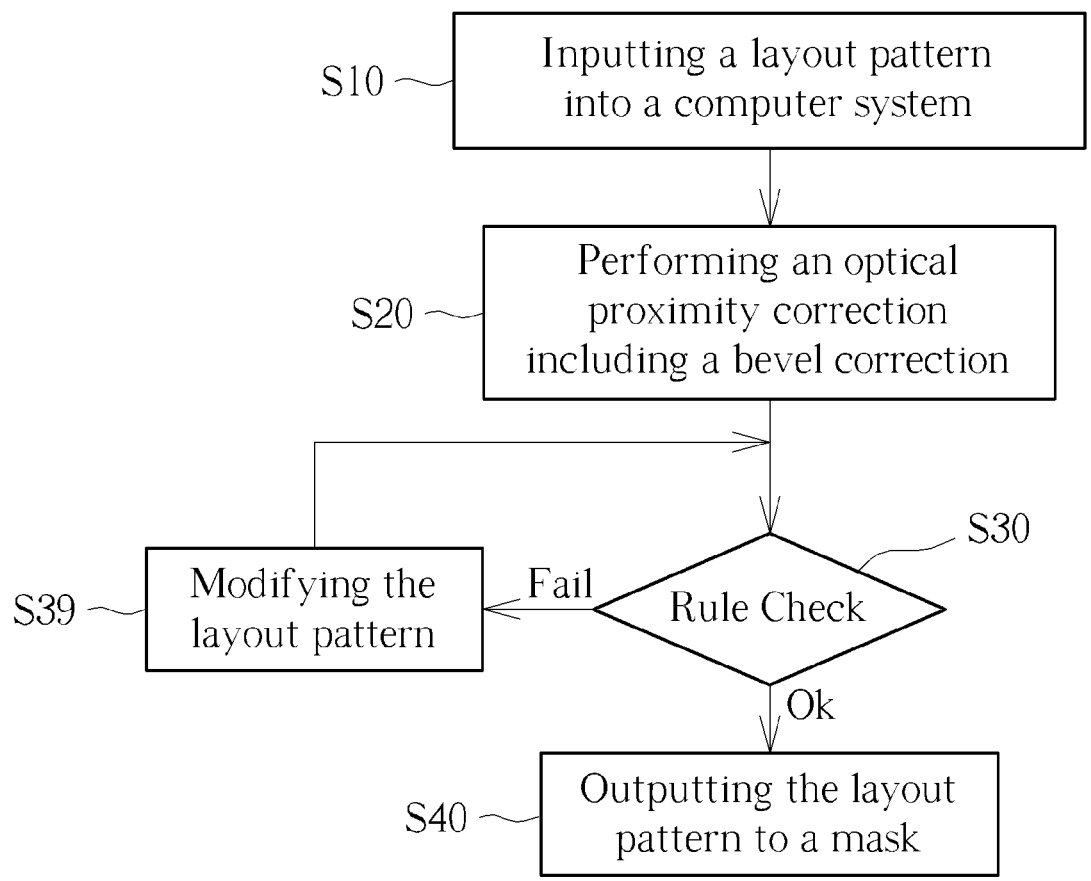
Figure 2:
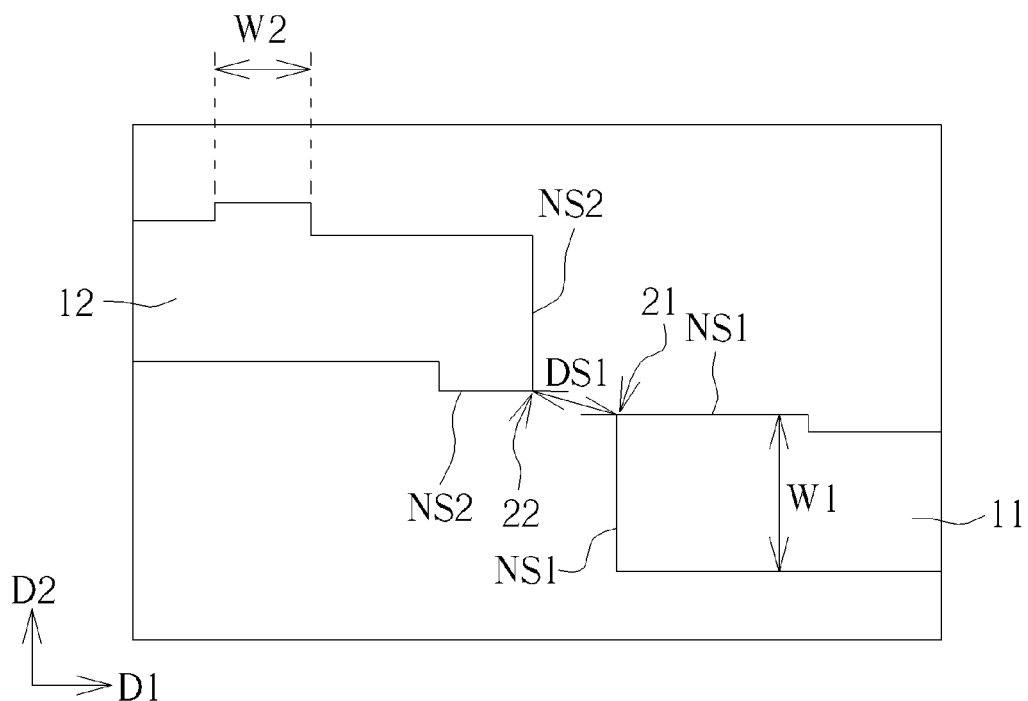

Please refer to FIGS. 1-5. FIGS. 1-5 are schematic drawings illustrating a method for correcting a layout pattern according to a first embodiment of the present invention. The method may include but is not limited to the following steps. As shown in FIG. 1 and FIG. 2, a layout pattern is provided. The layout pattern may include at least two adjacent sub patterns, such as a sub pattern 11 and a sub pattern 12 shown in FIG. 2. For sake of brevity, only a portion of the layout pattern is shown in the figure. The layout pattern in this embodiment may be preferably a mask pattern utilized for fabricating trenches, contact vias, or polysilicon gates of a semiconductor device, and the layout pattern may be a clear tone or a dark tone region according to the demand of the process. In some embodiments, the sub pattern 11 and the sub pattern 12 may include a rectangular sub pattern respectively, but not limited thereto. In some embodiments, the sub pattern may be a rectangular sub pattern or a patterned composed of at least one rectangular sub pattern. A corner 21 of the sub pattern 11 is adjacent to a corner 22 of the sub pattern 12, and a distance DS1 between the corner 21 and the corner 22 is shown in FIG. 2. The distance DS1 may be the shortest distance between the sub pattern 11 and the sub pattern 12. In step S10, the layout pattern is input into a computer system. In step S20, an optical proximity correction (OPC) including a bevel correction is then performed. Additionally, a process rule including the critical width, the critical space, or other design rules may be input into the computer system before the optical proximity correction.

As shown in FIGS. 1-4, the bevel correction mentioned above may include the following steps. A bevel may be formed at a corner of at least one of the two adjacent sub patterns. For example, a bevel BS1 may be formed at the corner 21 of the sub pattern 11. The bevel BS may be formed by chopping the corner 21. Subsequently, the bevel BS1 is moved toward an interaction X of two neighboring segments NS1 of the bevel BS1 if a distance between the bevel BS1 and the other sub pattern, such as the sub pattern 12, is larger than a minimum value. The two neighboring segments NS1 are directly connected to two ends of the bevel BS1. The angle between a surface of the bevel BS1 and a surface of the sub pattern 11 is not rectangular. In some embodiments, the bevel may be formed at the corner adjacent to the other sub pattern only, but the present invention is not limited to this. In some embodiments, the bevels may be formed at all corners of the sub pattern in the bevel correction. The corner 21 may include an orthogonal corner adjacent to the other sub pattern, such as the sub pattern 12. In other word, one of the neighboring segments NS1 may be parallel to a first direction D1, the other one of the neighboring segments NS1 may be parallel to a second direction D2, and the first direction D1 may be orthogonal to the second direction D2, but not limited thereto. The bevel BS1 is not parallel to the first direction D1 and the second direction D2. For example, in some embodiments, the included angle between the bevel BS1 and one of the neighboring segments NS1 may be substantially equal to 135 degrees, but the present invention is not limited to this. In some embodiments, the bevel BS1 may be a straight line substantially perpendicular to a direction parallel to the distance DS1 between the corner 21 and the corner 22. The included angles between the bevel BS1 and the two neighboring segments NS1 may be adjusted in accordance with other considerations, such as for satisfying the defined contour target.

In the bevel correction, the bevel BS1 is moved toward the interaction X of the two neighboring segments NS1 of the bevel BS1 when the distance between the bevel BS1 and the sub pattern 12 is larger than a minimum value. The minimum value may be defined by a mask rule check (MRC) specification, a design rule check (DRC) specification, or other process rules. The step of moving the bevel BS1 toward the interaction X of the two neighboring segments NS1 of the bevel BS1 is stop when the distance between the bevel BS1 and the other sub pattern, such as the sub pattern 12, is equal to the minimum value. Accordingly, a distance between the bevel of one of the two adjacent sub patterns, such as the bevel BS1, and the other sub pattern, such as the sub pattern 12, is larger than or equal to the minimum value after the bevel correction.

Figure 3:
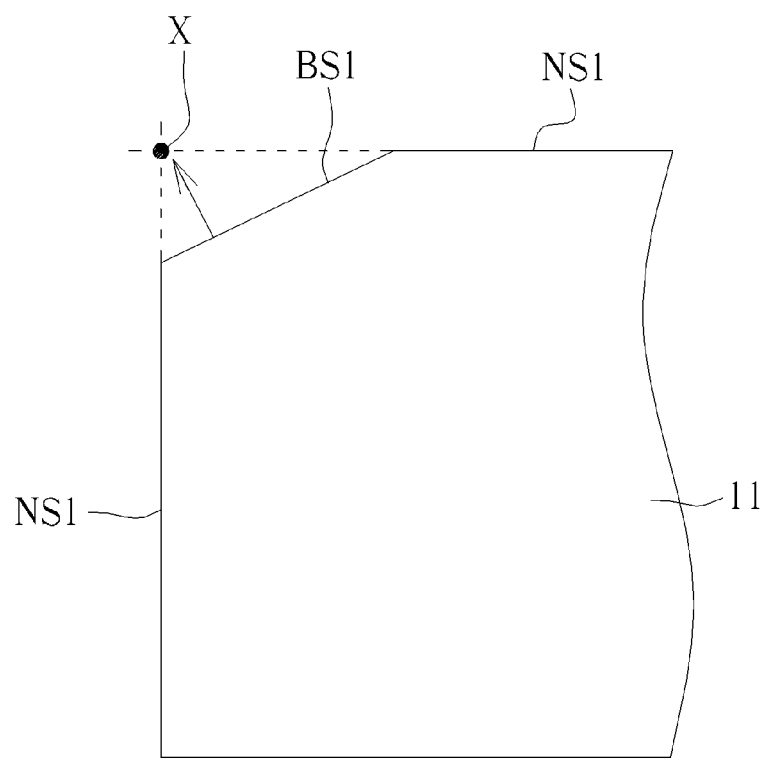
Figure 4:
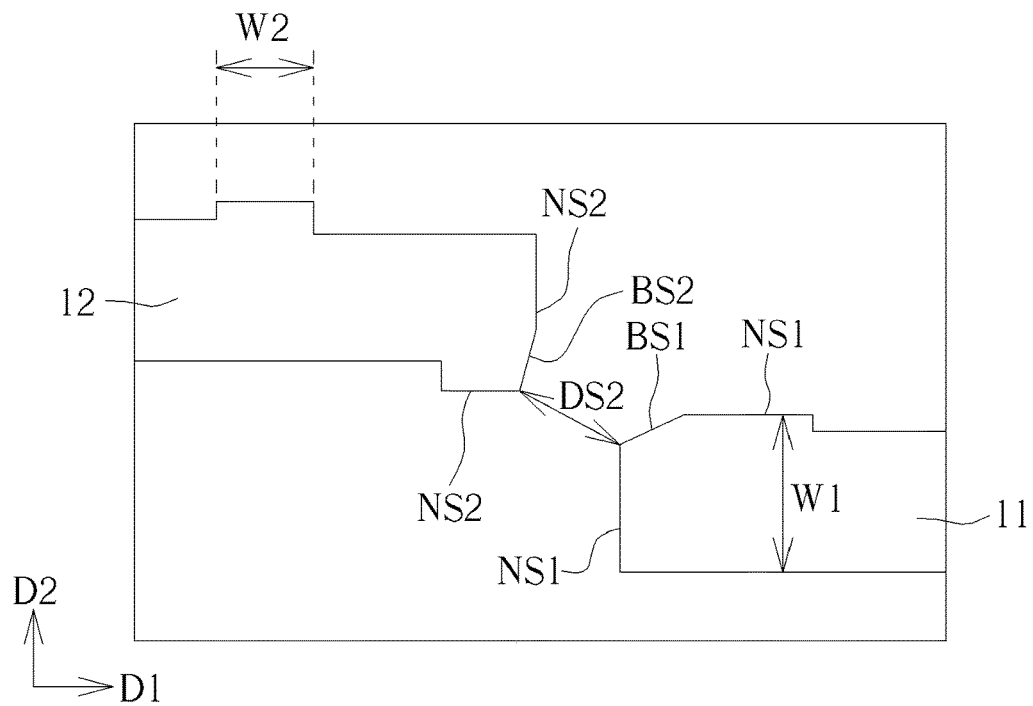

As shown in FIGS. 2-4, a bevel BS2 may be formed at the corner 22 of the sub pattern 12. In other words, two bevels may be formed at two adjacent corners of the two adjacent sub patterns respectively by the bevel correction. The bevel BS2 is also moved toward an interaction of two neighboring segments NS2 of the bevel BS2 if a distance between the bevel BS2 and the other sub pattern, such as the sub pattern 11, is larger than the minimum value. The step of moving the bevel BS2 toward the interaction of the two neighboring segments NS2 of the bevel BS2 is stop when the distance between the bevel BS2 and the other sub pattern, such as the sub pattern 11, is equal to the minimum value. Accordingly, a distance DS2 between the two bevels BS1 and BS2 is larger than or equal to the minimum value after the bevel correction. The distance DS2 may be the shortest distance between the two bevels BS1 and BS2 after the bevel correction. The angle between a surface of the bevel BS2 and a surface of the sub pattern 12 is not rectangular. The step of moving the bevel BS1 and the step of moving the bevel BS2 may be executed sequentially or executed simultaneously. In other words, the position of the bevel BS1 may be fixed during the step of moving the bevel BS2, or the position of the bevel BS2 may be fixed during the step of moving the bevel BS1. The bevel BS2 is also not parallel to the first direction D1 and the second direction D2. As shown in FIG. 4, the bevel BS1 may be not parallel with the bevel BS2, but the present invention is not limited to this. In some embodiments, the two bevels BS1 and BS2 may be parallel with each other. For example, in some embodiments, the included angle between the bevel BS1 and one of the neighboring segments NS1 may be substantially equal to 135 degrees, and the included angle between the bevel BS2 and one of the neighboring segments NS2 may also be substantially equal to 135 degrees, but the present invention is not limited to this. In some embodiments, the bevels BS1 and BS2 maybe straight lines substantially perpendicular to a direction parallel to the distance DS1 between the corner 21 and the corner 22. However, the included angles between the bevel BS1 and the two neighboring segments NS1 and the included angles between the bevel BS2 and the two neighboring segments NS2 may be adjusted respectively in accordance with other considerations, such as for satisfying different defined contour targets. Therefore, the bevel BS1 may be not parallel with the bevel BS2.

Additionally, in some embodiments, the bevels BS1 and the bevel BS2 may disappear after the bevel correction when the distance DS1 between the corner 21 of the sub pattern 11 and the corner 22 of the sub pattern 12 is larger than or equal to the minimum value, as shown in FIG. 2. In other words, the bevels are formed regardless of the distance between the sub patterns, and the bevels are moved toward the interaction of the two neighboring segments for fully extending the sub patterns.

Figure 5:
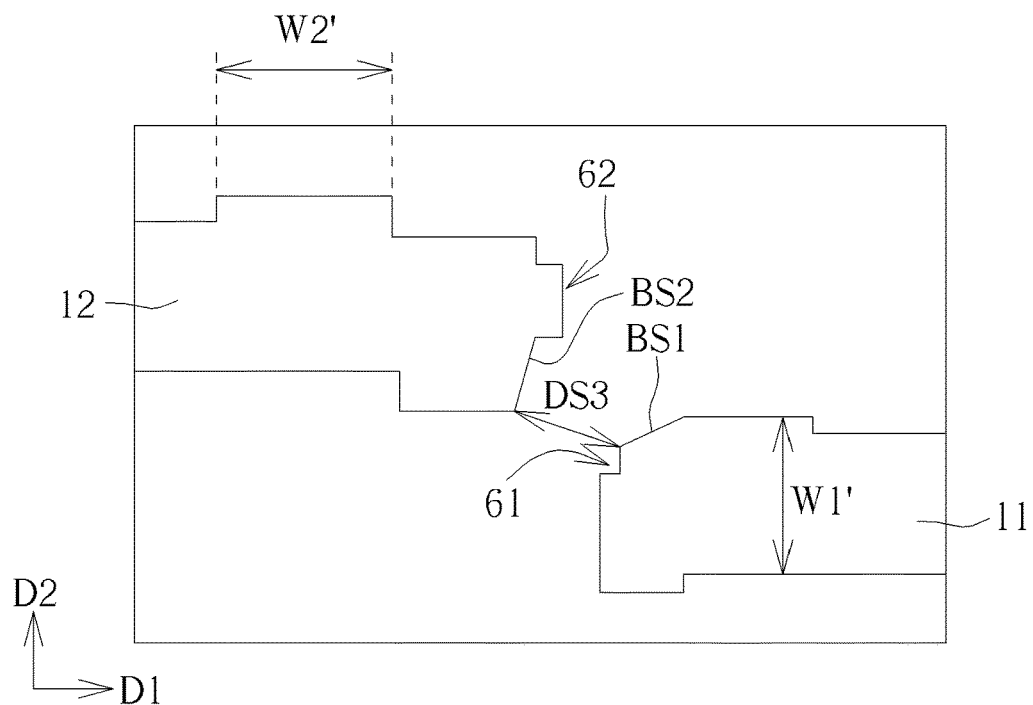

As shown in FIG. 5, the optical proximity correction may further include other corrections used to modify widths and/or line ends of each segment in the layout pattern. As shown in FIG. 4 and FIG. 5, a width W1 of the sub pattern 11 and a width W2 of a part of the sub pattern 12 may be modified to be a width W1' and a width W2' respectively. A notch 61 and/or a protrusion 62 may be formed by the corrections mentioned above. The corrections mentioned above may include an orthogonal correction, but not limited thereto. The notch 61 and/or the protrusion 62 may be formed on at least one of the sub patterns by the orthogonal correction. A shortest distance DS3 between the two bevels BS1 and BS2 after the corrections mentioned above may be different from or equal to the distance DS2 shown in FIG. 4, and the shortest distance DS3 is larger than or equal to the minimum value.

As shown in FIG. 1, in step S30, a rule check is performed after the optical proximity correction and before a step of outputting the layout pattern to a mask. The rule check may include a lithography rule check (LRC), a mask rule check (MRC), or other process and/or design rule checks. Verification is conducted through the rule check mentioned above. If the verification is complete, such as the LRC and the MRC are satisfied, step S40 is carried out to output the verified layout pattern from the computer system to a mask. The verified layout pattern is preferably used to fabricate a mask utilized in a lithography process later on. However, if the verification fails, step S39 is carried out to further modify the layout pattern for satisfying the rule check before the step of outputting the layout pattern for fabricating desirable masks.

Figure 6:
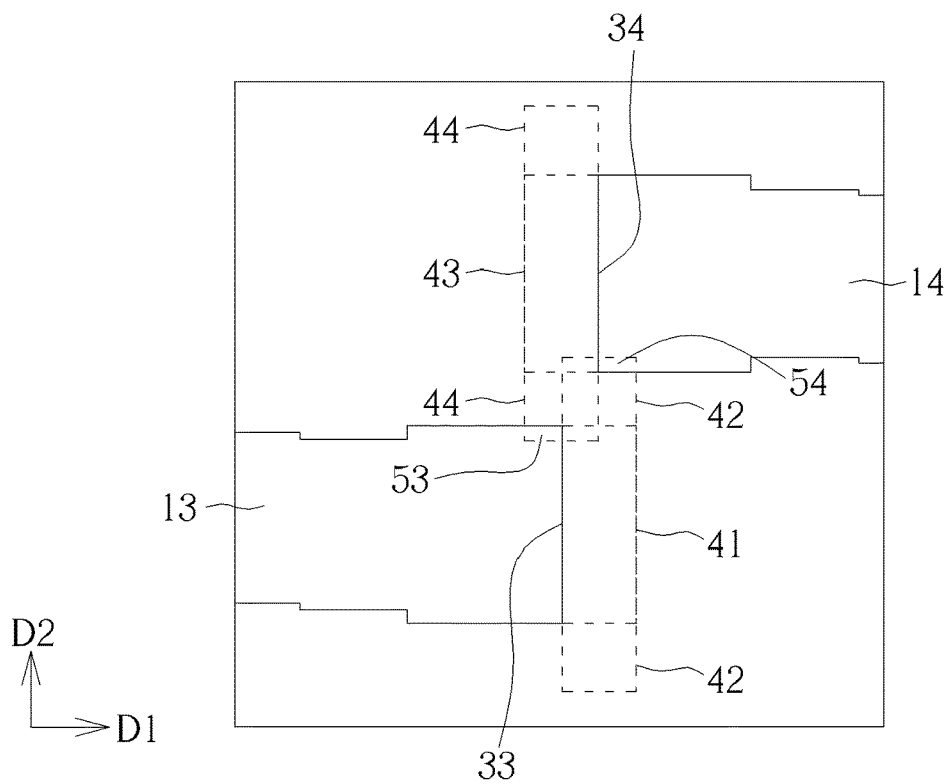
Figure 7:
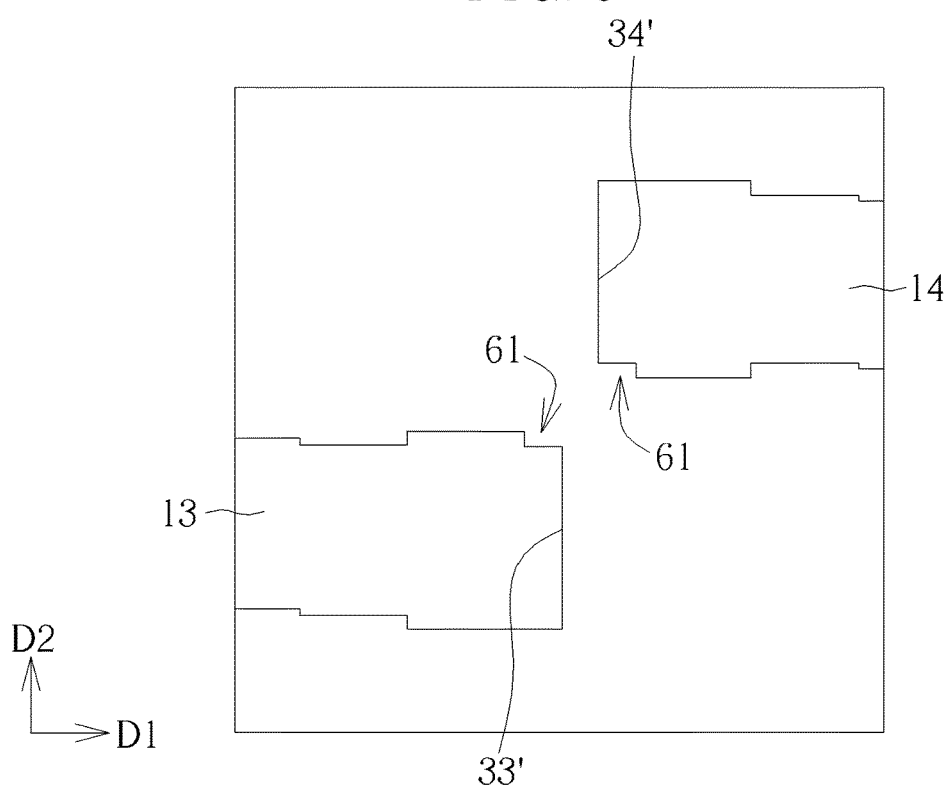

Please refer to FIG. 6 and FIG. 7. FIG. 6 and FIG. 7 are schematic drawings illustrating an orthogonal correction according to some embodiments of the present invention. The orthogonal correction may include but is not limited to the following steps. As shown in FIG. 6, a layout pattern including a sub pattern 13 and a sub pattern 14 is provided. A segment 33 is then selected from the sub pattern 13, and a rule-checking rectangle containing at least one square is expanded outward from the segment 33. In this embodiment, the segment 33 is preferably the end portion of the sub pattern 13 adjacent to other sub pattern, and the rule-checking rectangle is preferably composed of a rectangle 41 and two squares 42 formed at two ends of the rectangle 41. The length of the rectangle 41 is preferably equivalent to the length of the segment 33, and the width of the rectangle 41 and one sides of the square 42 is assigned as a minimum space according to a mask rule check (MRC) specification or a design rule check (DRC) specification. Subsequently, each square 42 and rectangle 41 within the rule-checking rectangle is verified to be whether overlapping other adjacent sub pattern. In this embodiment, the square 42 on top is determined to be overlapping a portion of an adjacent sub pattern 14. As the overlapping region exceeds the minimum space defined by the mask rule check specification or the design rule check specification, this overlapping region is assigned as a minimum space violation region 54. In order to satisfy the space specification defined, the minimum space violation region 54 generated during outward correction must be removed before forming a desirable layout pattern. After removing this minimum space violation region 54, a corrected sub pattern 14 may be obtained.

Similar to the correction of the sub pattern 13, another correction could be conducted from the sub pattern 14. As shown in FIG. 6, a segment 34 is selected from the sub pattern 14, and a rule-checking rectangle containing a rectangle 43 and two squares 44 is expanded outward from the segment 34. The squares 44 and the rectangle 43 of the rule-checking rectangle are then verified to be whether overlapping any adjacent sub pattern, and if an overlapping is confirmed, the overlapped portion of the layout pattern is assigned as the minimum space violation region. In this embodiment, the bottom square 44 is overlapping a portion of the adjacent sub pattern 13, hence the portion of the sub pattern 13 overlapped by the square 44 is assigned as a minimum space violation region 53. The minimum space violation region 53 of the sub pattern 13 is removed thereafter and a corrected sub pattern 13 is output to complete the orthogonal correction process. As shown in FIG. 7, the corrected sub patterns 13 and 14 are composed of primarily of a polygon pattern, in which each polygon pattern includes a segment 33'/34' utilized for generating a rule-checking rectangle. A substantially rectangular notch 61 maybe formed in the corrected sub pattern 13/14 corresponding to the location of the minimum space violation region 53/54 removed previously in FIG. 6.

Figure 8:
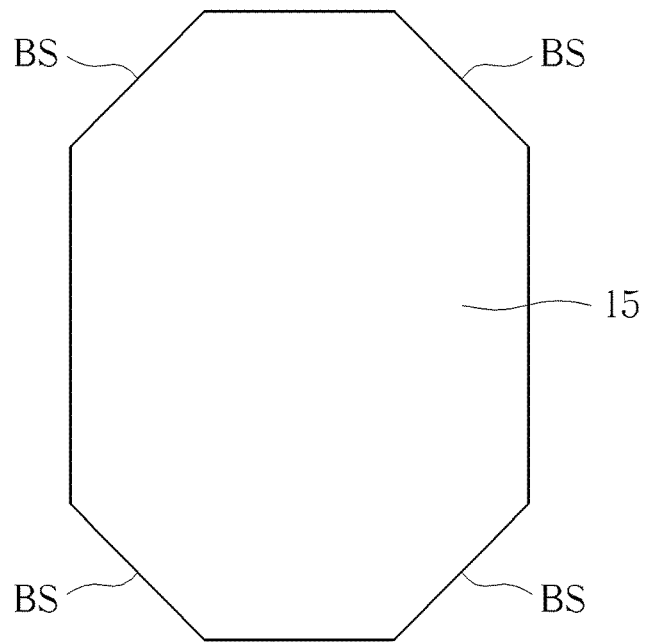
FIG. 8 is a schematic drawing illustrating a sub pattern after the step of forming bevels at corners according to some embodiments of the present invention.

Please refer to FIG. 8. FIG. 8 is a schematic drawing illustrating a sub pattern after the step of forming bevels at corners according to some embodiments of the present invention. As shown in FIG. 8, bevels BS may be formed at all corners of a sub pattern 15. For example, the sub pattern 15 may be a rectangle before the bevel correction, and the sub pattern 15 may become an octagon after the step of forming the bevels BS on the four corners of the sub pattern 15 and before the step of moving each of the bevels toward an interaction of two neighboring segments of each of the bevel BS.

Figure 9:
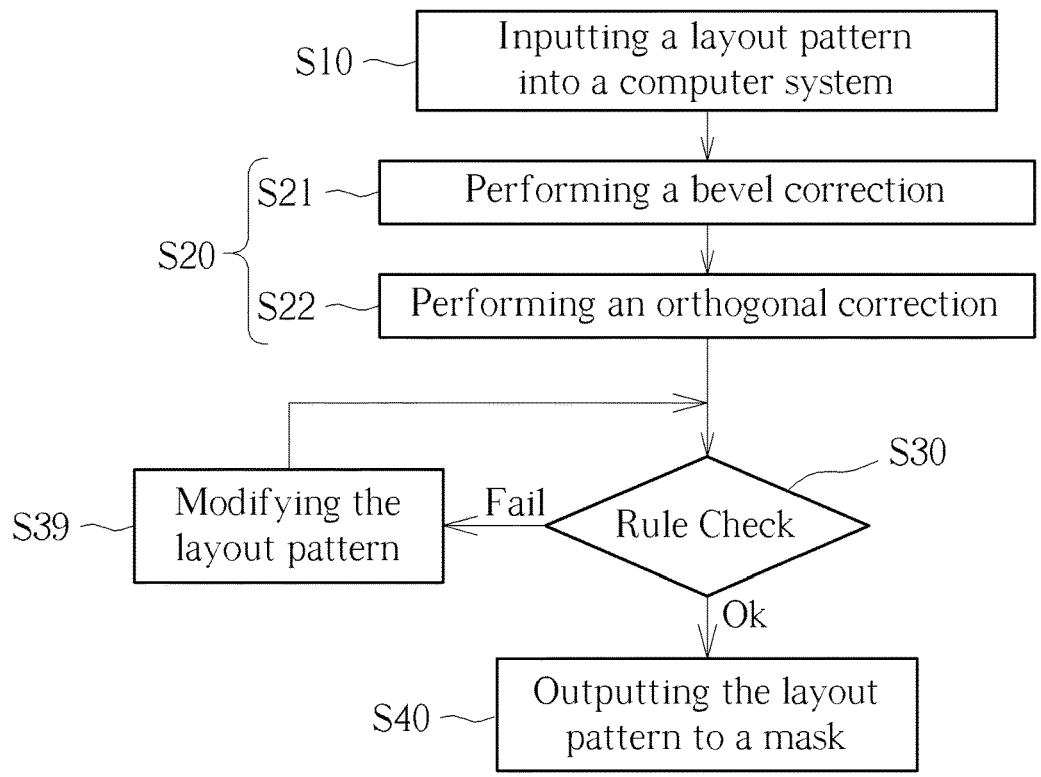
Figure 10:
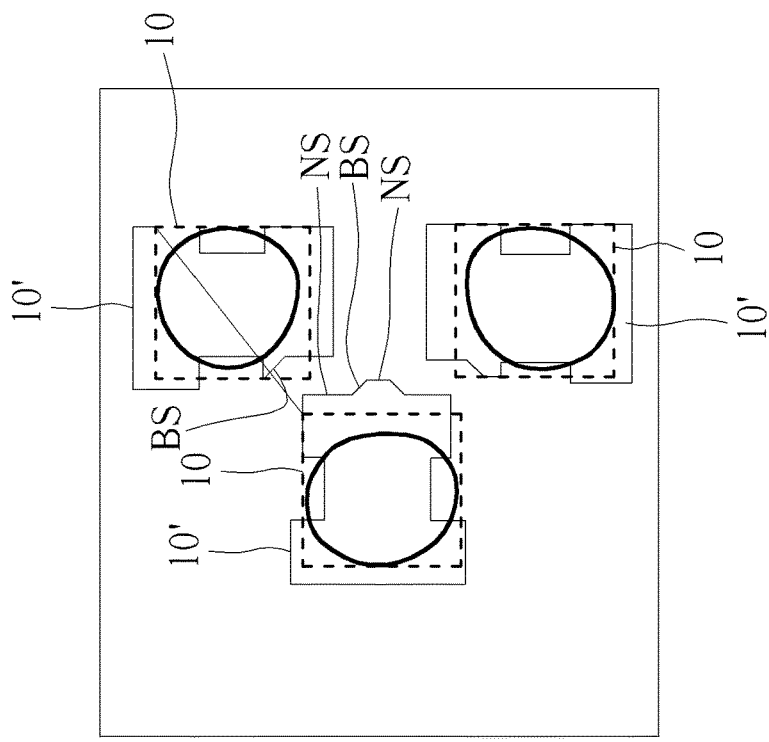
Figure 10:
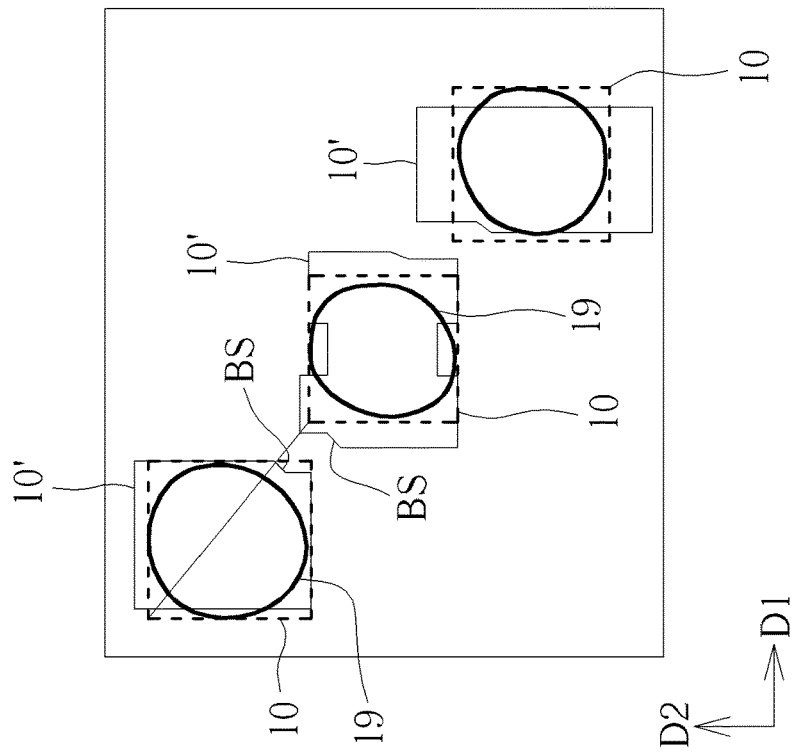

Please refer to FIG. 9 and FIG. 10. FIG. 9 and FIG. 10 are schematic drawings illustrating a method for correcting a layout pattern according to a second embodiment of the present invention. As shown in FIG. 9, the step S20 of performing the optical proximity correction may include step S21 and step S22. In the step S21, the bevel correction is performed. In the step S22, the orthogonal correction is performed after the bevel correction. As shown in FIG. 10, original sub patterns 10 are corrected to be sub patterns 10' after the optical proximity correction. Each of the original sub patterns 10 is a rectangular sub pattern. Simulated contours 19 of the corrected sub patterns 10' may be generated, and the defined targets, such as the original sub patterns 10, are checked to verify if the targets are within or overlapped with the simulated contours 19. In some of the sub patterns 10' after the optical proximity correction, two segments NS directly connected to two opposite ends of the bevel BS may be parallel to each other, but not limited thereto. The angle between a surface of the bevel BS and a surface of the sub pattern 10' is not rectangular, and the angle between a surface of the bevel BS and a surface of the original sub pattern 10 is not rectangular.

Figure 11:
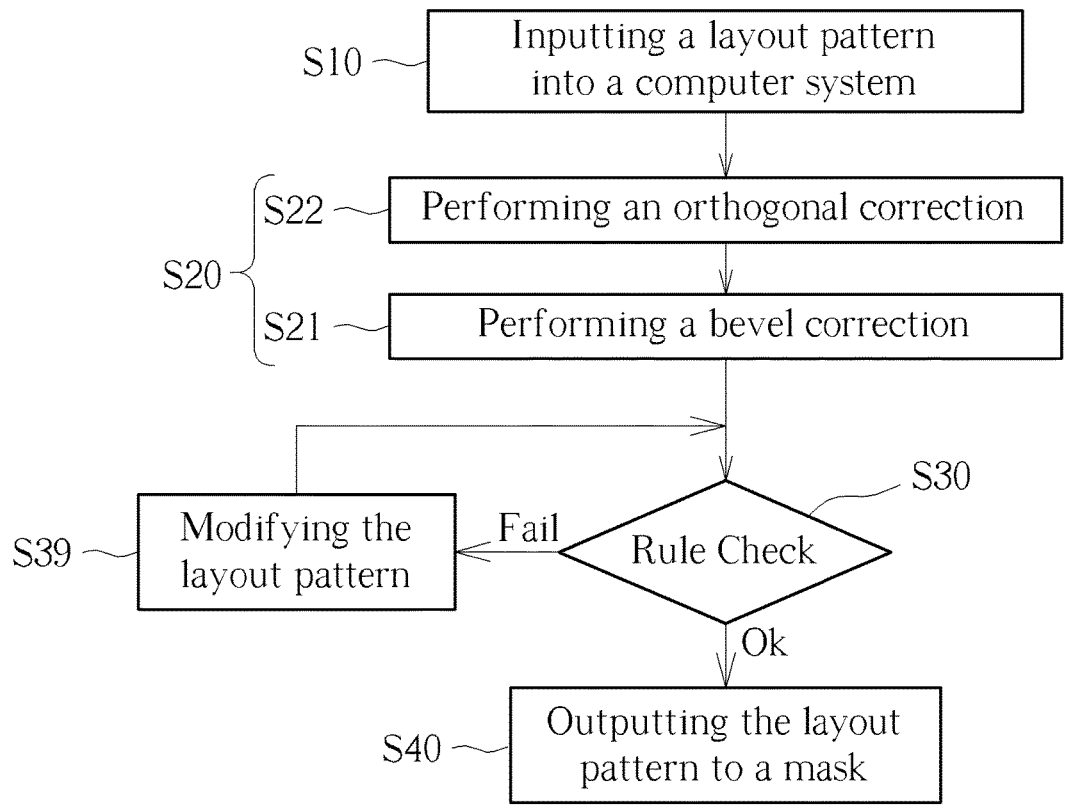
Figure 12:
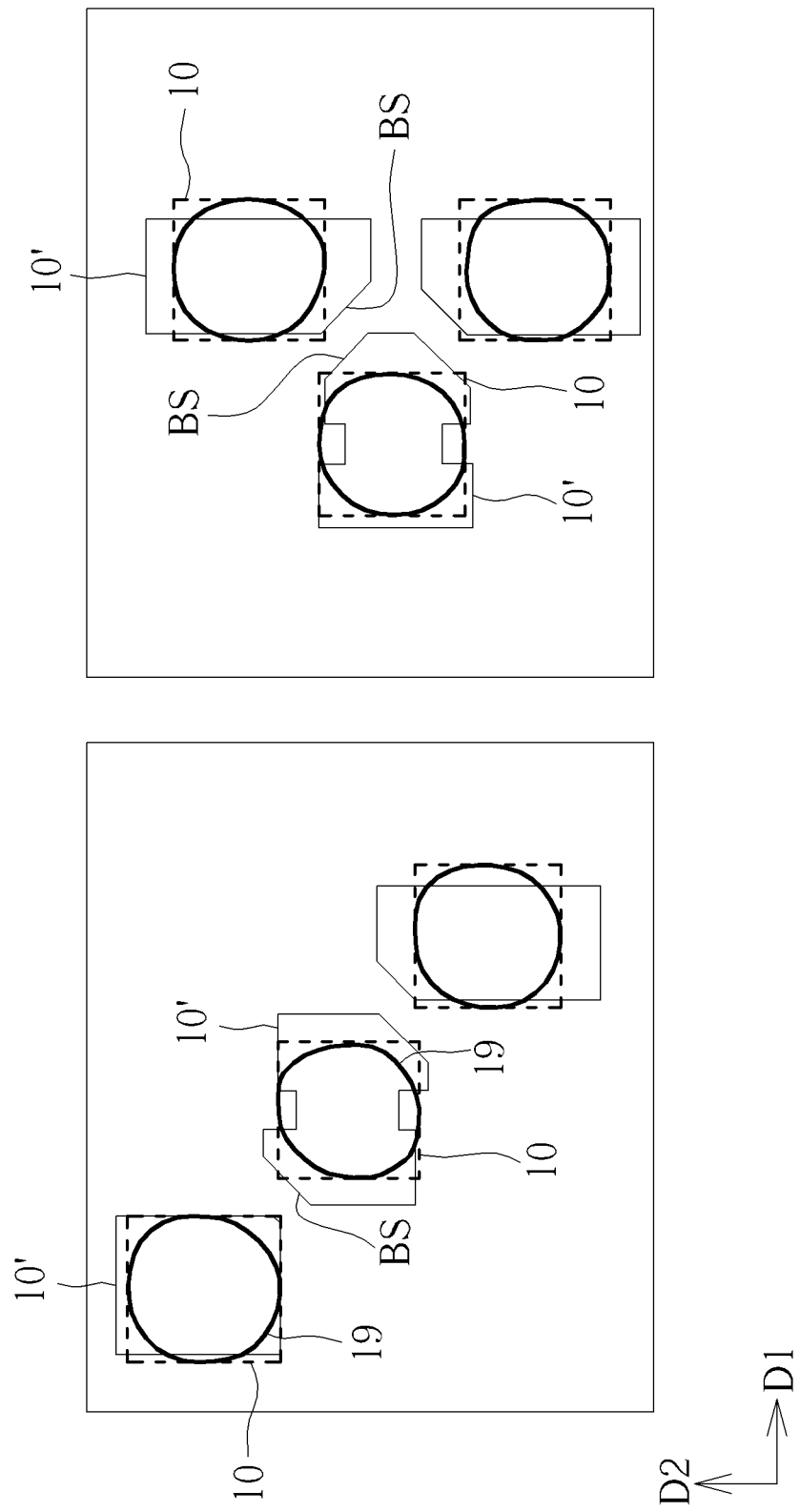

Please refer to FIG. 11 and FIG. 12. FIG. 11 and FIG. 12 are schematic drawings illustrating a method for correcting a layout pattern according to a third embodiment of the present invention. As shown in FIG. 11, the step S20 of performing the optical proximity correction may include the step S21 and the step S22, and the step S22 is executed before the step S21 in this embodiment. In other words, the orthogonal correction is performed before the bevel correction in this embodiment. As shown in FIG. 12, original sub patterns 10 are corrected to be sub patterns 10' after the optical proximity correction. In some of the sub patterns 10' after the optical proximity correction, the bevels BS of different sub patterns 10' may be parallel with each other, but not limited thereto.

To summarize the above descriptions, in the method for correcting the layout pattern of the present invention, the optical proximity correction including the bevel correction is performed to forming the bevel at the corner of the sub pattern in the layout pattern. The bevel is moved toward the interaction of two neighboring segments of the bevel under the distance limitation between two adjacent sub patterns for fully extending the sub patterns in the layout pattern. Additionally, the bevel correction may be performed after the orthogonal correction of the optical proximity correction, and the bevel correction may be used to fix corner mask rule check issue and the layout pattern will not be constrained by the orthogonal correction accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for correcting a layout pattern, comprising:
   providing a layout pattern comprising at least two adjacent rectangular sub patterns;
   inputting the layout pattern into a computer system;
   performing an optical proximity correction comprising:
   a bevel correction comprising:

forming a bevel at a corner of at least one of the two adjacent rectangular sub patterns, wherein the corner is adjacent to the other rectangular sub pattern, the bevel is formed by chopping the corner, and the angle between a surface of the bevel and a surface of the rectangular sub pattern is not a right angle; and checking a distance between the bevel and the other rectangular sub pattern;

moving the bevel toward an interaction of two neighboring segments of the bevel, when the distance between bevel and the other rectangular sub pattern is larger than a minimum value and a size of the at least of the two adjacent rectangular sub patterns having the bevel at the corner is expanded by the step of moving the bevel toward the interaction of the two neighboring segments of the bevel; and outputting the layout pattern to a mask after the optical proximity correction.

2. The method for correcting the layout pattern of claim 1, wherein the corner comprises an orthogonal corner adjacent to the other rectangular sub pattern.

3. The method for correcting the layout pattern of claim 1, wherein a distance between the bevel of one of the two adjacent rectangular sub patterns and the other rectangular sub pattern is larger than or equal to the minimum value after the bevel correction.

4. The method for correcting the layout pattern of claim 1, wherein two bevels are formed at two adjacent corners of the two adjacent rectangular sub patterns respectively by the bevel correction.

5. The method for correcting the layout pattern of claim 4, wherein a distance between the two bevels is larger than or equal to the minimum value after the bevel correction.

6. The method for correcting the layout pattern of claim 4, wherein the two bevels are parallel with each other.

7. The method for correcting the layout pattern of claim 4, wherein the two bevels are not parallel with each other.

8. The method for correcting the layout pattern of claim 1, wherein the minimum value is defined by a mask rule check (MRC) specification or a design rule check (DRC) specification.

9. The method for correcting the layout pattern of claim 1, wherein the optical proximity correction further comprises an orthogonal correction, and the orthogonal correction comprises forming a notch or a protrusion on at least one of the rectangular sub patterns.

10. The method for correcting the layout pattern of claim 9, wherein the orthogonal correction is performed after the bevel correction.

11. The method for correcting the layout pattern of claim 10, wherein two segments directly connected to two opposite ends of the bevel are parallel to each other after the bevel correction.

12. The method for correcting the layout pattern of claim 9, wherein the orthogonal correction is performed before the bevel correction.

13. The method for correcting the layout pattern of claim 1, further comprising:

performing a rule check after the optical proximity correction and before the step of outputting the layout pattern to the mask.

14. The method for correcting the layout pattern of claim 13, wherein the rule check comprises a lithography rule check or a mask rule check.

15. The method for correcting the layout pattern of claim 1, wherein the step of moving the bevel toward the interaction of the two neighboring segments of the bevel is stop when the distance between the bevel and the other rectangular sub pattern is equal to the minimum value.

16. The method for correcting the layout pattern of claim 1, wherein a plurality of bevels are formed at all corners of the rectangular sub pattern in the bevel correction.

* * * * *